United States Patent [19]
Martin et al.

[11] Patent Number: 5,769,645
[45] Date of Patent: Jun. 23, 1998

[54] ELECTRICAL CONNECTOR FOR DUAL PRINTED CIRCUIT BOARDS

[75] Inventors: Galen Monroe Martin, Jamestown; Larry George Novotny, Clemmons; Donald Kent Hughes, Kernersville, all of N.C.; Samuel Garner Bouse, Jr., Huntsville, Ala.

[73] Assignee: The Whitaker Corporation, Wilmington, Del.

[21] Appl. No.: 912,217

[22] Filed: Aug. 15, 1997

Related U.S. Application Data

[60] Continuation of Ser. No. 785,728, Jan. 12, 1997, Pat. No. 5,709,557, which is a division of Ser. No. 354,197, Dec. 12, 1994, abandoned.

[51] Int. Cl.⁶ ............................................. H01R 9/09
[52] U.S. Cl. ................................ 439/79; 439/74
[58] Field of Search .................. 439/74, 76.1, 79, 439/80, 695; 361/785

[56] References Cited

U.S. PATENT DOCUMENTS

4,723,196  2/1988  Hofmeister et al. ............ 439/76.1
5,211,586  5/1993  Maue et al. ..................... 439/695

*Primary Examiner*—Gary F. Paumen
*Assistant Examiner*—Brian J. Biggi
*Attorney, Agent, or Firm*—Mary K. VanAtten

[57] ABSTRACT

An input/output electrical connector header 102 includes at least two rows of terminal pins 140 which can be connected to two separate printed circuit boards 106 and 108. The same header 102 provides input and output for both printed circuit boards 106, 108. The terminal pins 140 in each of the rows extend through openings 130 in the same header housing wall 126. A separable interconnection is made between pins in a second terminal row and a second printed circuit board 108 at the rear of the header 102. This separate connection can be established by a separate multiposition connector 114, 214, 314 or 414 containing receptacle contacts 116, 216, 316, 416 respectively. In other embodiments, this separate connector 514, 614, 714 and 1214, includes the terminal pins in the second terminal row in the separate connector. In still other embodiments, the terminal pins in the second terminal row 840, 940, 1040 and 1140, are stamped and formed contacts with a printed circuit board edge contact 890, 990, 1090, and 1190 respectively located at the rear end of the terminal pin.

12 Claims, 13 Drawing Sheets

ELECTRICAL CONNECTOR FOR DUAL PRINTED CIRCUIT BOARDS

This application is a continuation of patent application Ser. No. 08/785,728, filed Jan. 17, 1997, now U.S. Pat. No. 5,709,557, which is a divisional of patent application Ser. No. 08/354,197, filed Dec. 12, 1994, now abandoned.

FIELD OF THE INVENTION

This invention is related to the use of electrical connectors to provide an input/output interface for electrical components including multiple printed circuit boards. More specifically, this invention is related to the use of printed circuit board headers to connect multiple printed circuit boards in an enclosure or on one side of a bulkhead with an external cable. Additionally, this invention is related to sealing the mating interface between a cable and a component containing more than one printed circuit board.

DESCRIPTION OF THE PRIOR ART

Multiposition printed circuit board electrical connector headers are typically used to interconnect printed circuit boards to electrical cables or a wire harness. These headers typically include printed circuit board pins mounted in the header in several rows. The terminal pins are typically either solid pins or stamped and formed pins. The pins extend through a molded header housing between a mating face and a rear face. An electrical connector receptacle attached to the conductors in a cable or harness is mated to the header and the header pins at the header mating face. The opposite ends of the pins are attached to a printed circuit board, typically by soldering the pins to the board. Both straight pin and right angle pin versions of these headers are common.

One conventional use of these headers is as an input/output device for the electrical component including the printed circuit board. In most cases, the header is mounted on one edge of the printed circuit board. The components are typically mounted in an enclosure or box or behind a bulkhead, and the input/output header extends through a hole in one wall of the enclosure. In some applications, such as in the automotive industry, it is necessary to seal this input/output interface. Elastomeric seals establish sealing integrity between the periphery of the header and the wall containing the opening through which the header mating face extends. The mating interface between the header and the connector receptacle can also include an elastomeric seal. Individual seals can be used to establish a seal between each pin and the header housing. In some cases an interference fit between solid pins and the header housing will adequately seal this fluid path.

Prior art connectors are available for sealing an input/output connector used with a single printed circuit board. However, many components use multiple printed circuit boards. These multiple printed circuit boards can be interconnected so that the input and output are on one printed circuit board. However, routing all of the input/output through one printed circuit board can require more circuitry on the printed circuit boards. One solution is to use separate input/output connectors on each printed circuit board. Another solution is to use a split header in which a separate header is used on multiple printed circuit boards and the multiple headers are mated to a single connector receptacle. However, this approach adds an additional sealing interface between the two headers.

SUMMARY OF THE INVENTION

A single electrical connector header provides the input/output interface for two separate printed circuit boards in this invention. The header includes terminal pins in at least two rows which are mounted in a molded insulative housing. The pins extend through openings between the rear and the mating faces of the header so that one mating electrical connector receptacle can be mated with the header and with all of the pins in the header.

The pins in one row are used to establish a connection with a first printed circuit board. These pins include board contact tails. In the preferred embodiments these board contact tails comprise solder tails for establishing a permanent contact to the first printed circuit board.

The rear ends of the pins in at least one second row extend in a different direction from the rear ends of other pins used to establish contact with the first printed circuit board. In each of the preferred embodiments, the two printed circuit boards are parallel to each other. In each of the preferred embodiments, the first printed circuit board is located at the bottom of the header and the pins in the first row or first rows comprise right angle pins which are bent downward towards the lower printed circuit board. In some embodiments, the pins in the second row or rows extend upwardly towards the second terminal row. In other embodiments, the pins in the second row or second rows extend straight back.

Several different configurations are used to provide the separable connection with the second printed circuit board. Some embodiments use a connector which includes receptacle contacts matable with the rear ends of the terminal pins. This connector can be rigidly mounted on the second printed circuit board or an intervening flexible jumper may connect the separable connector to the second printed circuit board.

In other embodiments, the terminal pins in the second row are mounted in a housing to form the separable connector. The separable connector can then be inserted into a cavity on the rear face of the header and the pins inserted through openings in the header housing wall between the rear face and the mating face.

Another group of embodiments use stamped and formed terminal pins in the second terminal row. These pins have printed circuit board edge connector contacts on their rear end to establish a separable electrical connection directly with the second printed circuit board.

In each of the preferred embodiments, the terminal pins of all of the rows extend through a common housing wall. Therefore no seal must be established between a connector attached to the first printed circuit board and another connector connected to the second printed circuit board.

BRIEF DESCRIPTION OF THE DRAWINGS

FIGS. 1A, 1B and 1C are views of a first embodiment of this invention which employs a separate multiposition electrical connector with surface mount receptacle terminals to connect terminal pins to a second printed circuit board.

FIGS. 2A and 2B are views of a second embodiment of this invention which employs a separate multiposition electrical connector to connect terminal pins to a second printed circuit board. The second connector is attached to the second printed circuit board by a flexible jumper.

FIGS. 3A and 3B are views of a third embodiment of this invention which employs a separate multiposition electrical connector to connect terminal pins to a second printed circuit board. The second connector is attached to the second printed circuit board by a flexible jumper, but the header pins through which interconnection is made to the second printed circuit board are straight pins.

FIGS. 4A and 4B are views of a fourth embodiment of this invention which employs a separate multiposition electrical connectors to connect terminal pins to a second printed circuit board. The second connector is attached to the second printed circuit board by through hole connections.

FIGS. 5A and 5B are views of a fifth embodiment of this invention which employs a separate multiposition electrical connectors to connect terminal pins to a second printed circuit board. The second connector includes a row of terminal pins which are inserted into the header housing which includes a rearwardly facing cavity to receive the second connector.

FIGS. 6A and 6B are views of a sixth embodiment of this invention which employs a separate multiposition electrical connectors to connect terminal pins to a second printed circuit board. The separate connector includes a row of terminal pins which are inserted into the header housing which includes a rearwardly facing cavity to receive the second connector. These terminal pins are soldered to the second printed circuit board by a surface mount solder tail on the end of each pin.

FIGS. 12A and 12B are views of a twelfth embodiment of this invention which is similar to the sixth and seventh embodiment.

DETAILED DESCRIPTION OF THE PREFERRED EMBODIMENTS

Each of the embodiments of this invention comprises a dual input/output electrical connector header for use with the two printed circuit boards. These two printed circuit boards are mounted in a chassis or enclosure, and the single electrical connector provides separate input/output lines for each printed circuit board. This input/output is not only provided by a single connector, but the connector extends through a single opening in the chassis or enclosure. The single connector, here in the form of a printed circuit board header, comprises a single housing member through which pins to be connected to both printed circuit boards extend. This single housing member in each embodiment has a plurality of openings through which terminal pins extend. In each of the preferred embodiments, this single housing member has a single internal wall containing these openings. A single connector with a single connector housing extending through a single opening simplifies sealing for the input/output connector interface. The only sealing interfaces are a peripheral seal between the connector and the enclosure and the sealing interface between each of the pins and the housing. Since the pins can be press fit into the housing openings to provide this sealing interface, only a single peripheral seal is needed. If multiple electrical connectors had been employed, an additional seal between the separate connectors, or separate connector housings, would be necessary. Each of the disclosed embodiments of this invention employ a different approach to connecting the second printed circuit board to or through the input/output connector or header, but each uses a single header housing for pins to be connected to two different printed circuit boards.

Figure 1A:
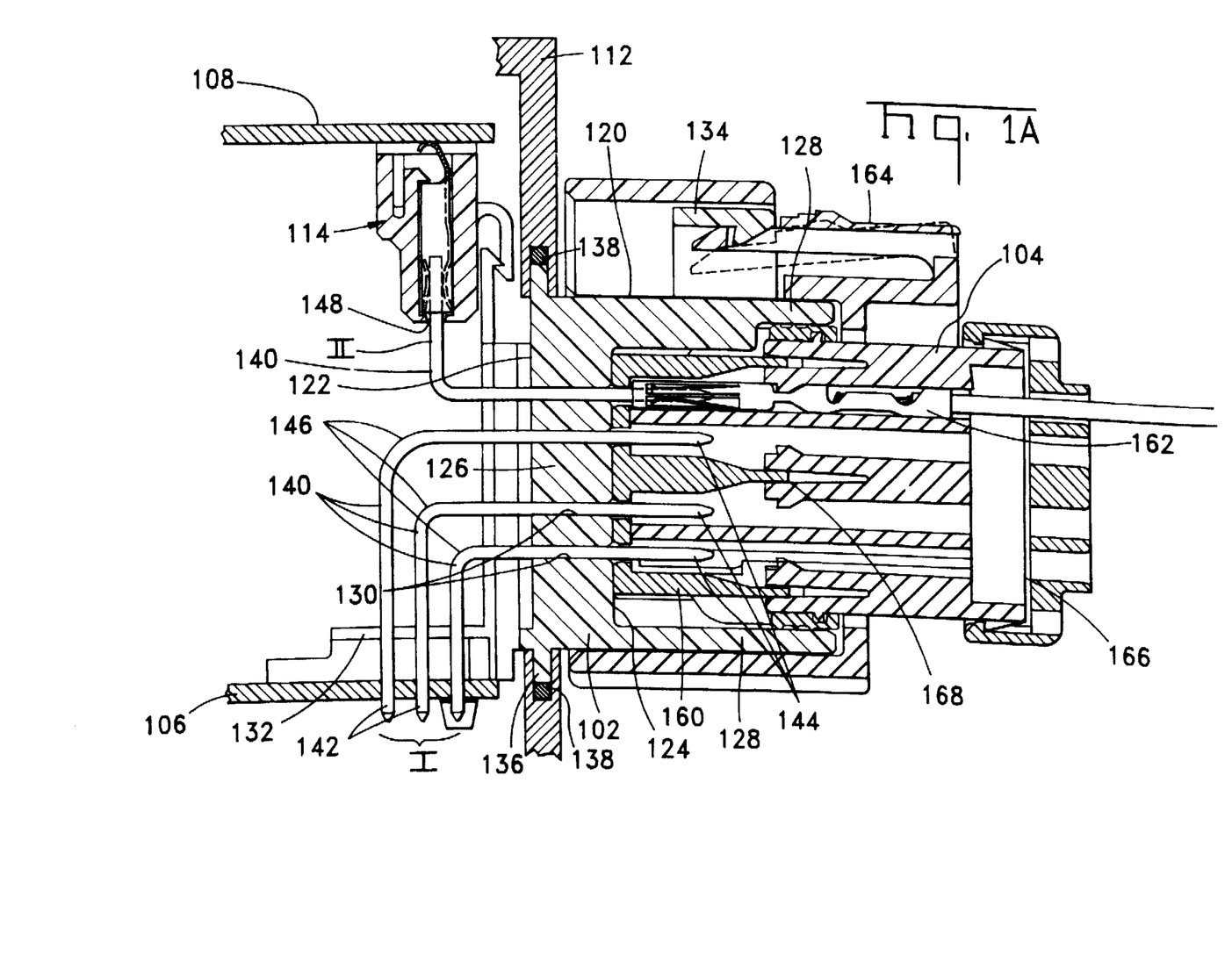
FIG. 1A is a sectional view of the electrical connector header and mating receptacle connector.
Figure 1B:
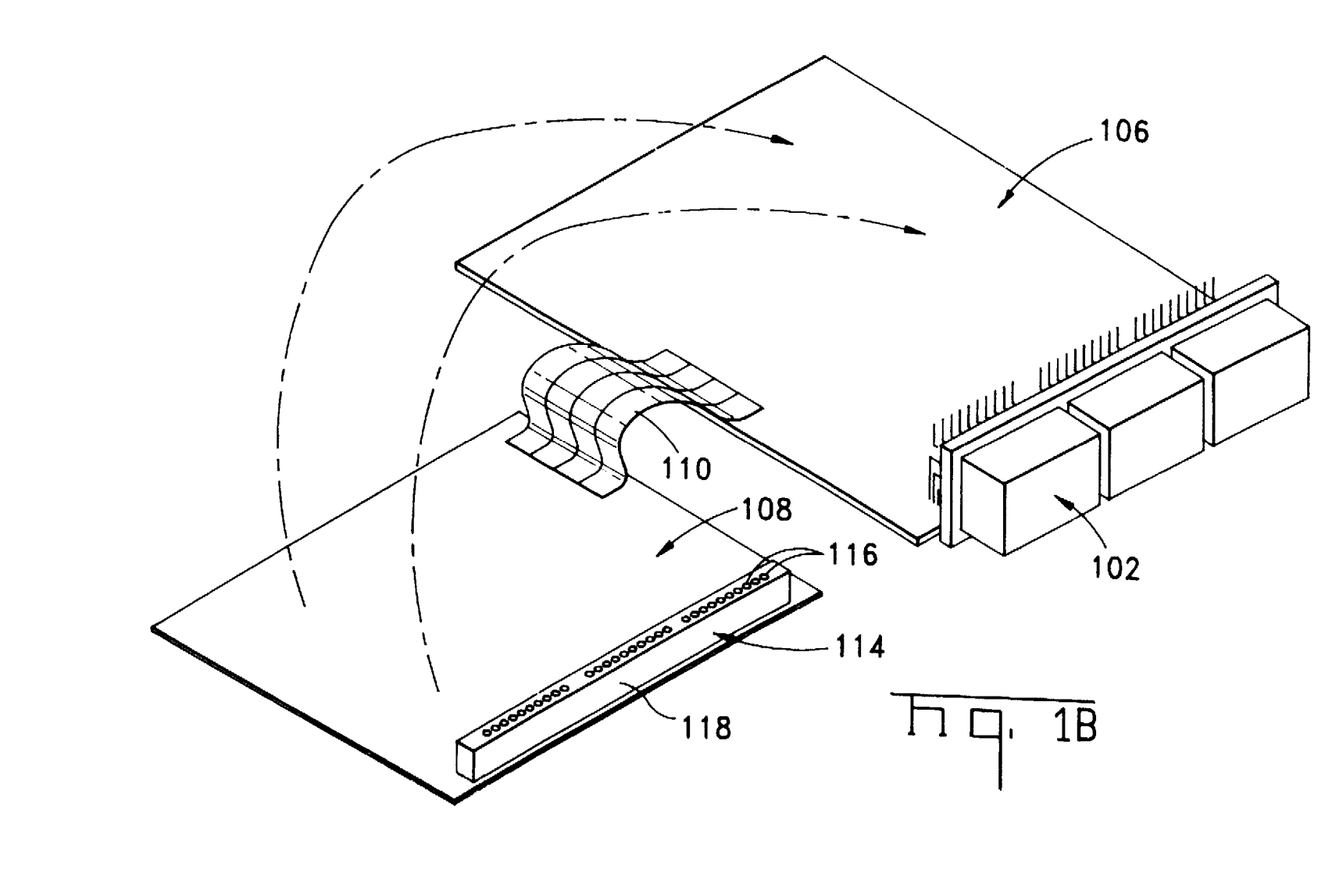
FIG. 1B is a schematic showing the manner in which the two printed circuit boards are attached to the electrical connectors.
Figure 1C:
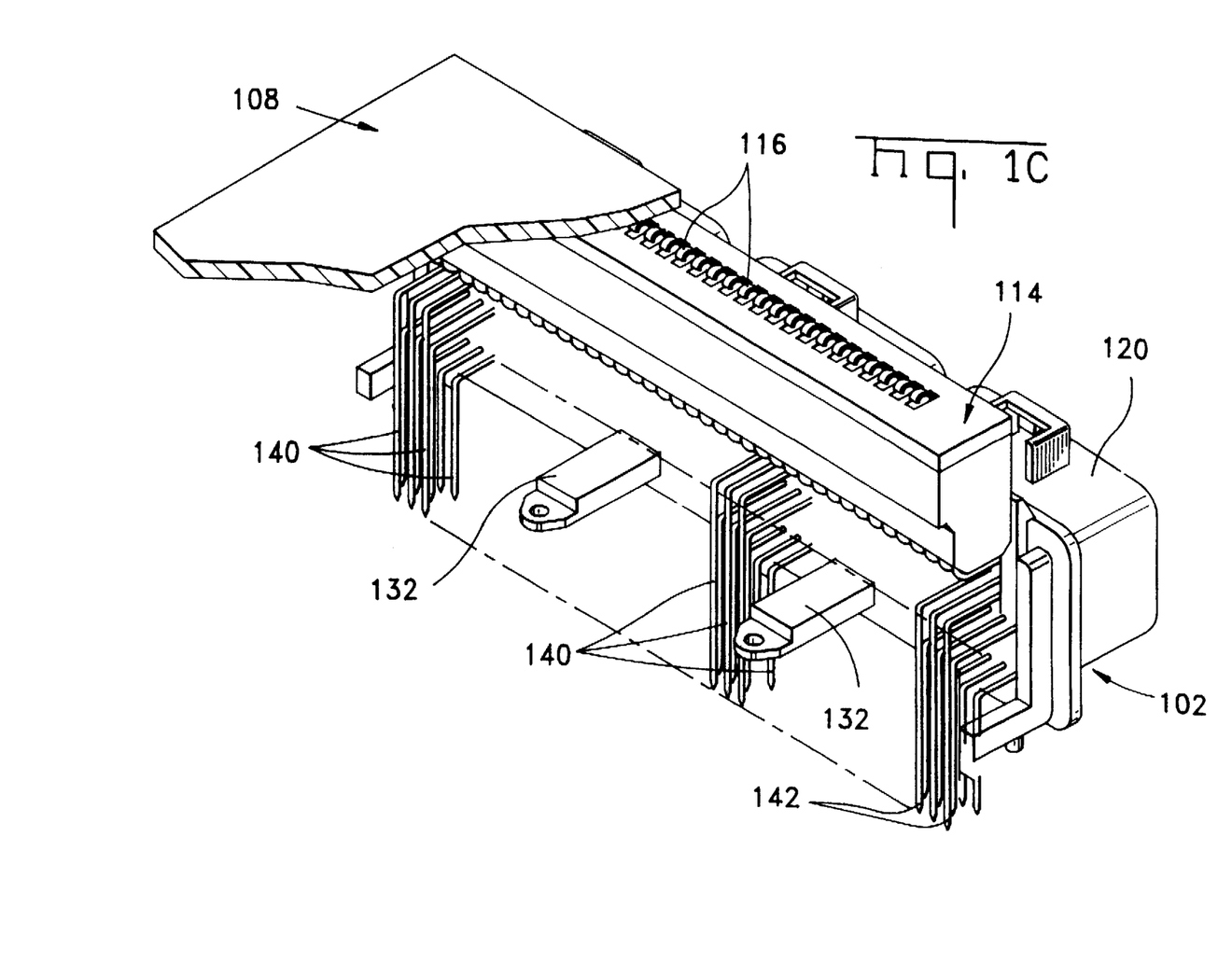
FIG. 1C is a perspective view of the electrical connector header.

Reference numerals have been assigned to each of the multiple embodiments of this invention so that similar elements or each embodiment are referred to by a reference numeral in which the last two digits, or least significant digits, refer to an analogous element. For example, the terminal pins in each embodiment are referred to by a reference numeral ending in -40. The terminal pins for the first embodiment are referred to as pins 140, and the terminal pins for the twelfth embodiment are referred to by the reference numeral 1240. Although all of the terminal pins in each embodiment are referred to by a reference numeral ending in -40, roman numeral I and II have been used to identify terminal pins connected to the first and second printed circuit boards respectively The first embodiment is shown in FIGS. 1A, 1B, and 1C, and the input/output electrical connector header 102 is shown mounted to a mating electrical connector receptacle 104 in these figures. The mating connector receptacle is not shown for any of the other embodiments and it should be understood that the same, or substantially the same, mating connector receptacle can be used with the headers of each of the twelve embodiments.

The schematic of FIG. 1B shows the manner in which the electrical connector header 102 is connected to the two printed circuit boards 106 and 108. Header 10 is mounted on the first printed circuit board 106, and a printed circuit board jumper 110 connects the two printed circuit boards. This flexible jumper 110 would typically include conductors having sufficient current capacity to deliver electrical power from one printed circuit board to the other. A multiposition electrical connector 114 is attached to the second printed circuit board 108 and this multiposition connector or second connector includes electrical terminals 116, of conventional construction, for establishing a disconnectable electrical interconnection with terminal pins 140. Terminals 116 can comprise stamped and formed receptacle terminals for establishing a resilient connection with pins 140. These terminals 116 are positioned in a single row in a multicavity second connector housing 118. The arrows in FIG. 1B show the manner in which the second printed circuit board 108 is rotated into position so that the second multiposition electrical connector can be mated with the terminal pins 140 in the upper row II of the header 102. This mated configuration is shown in FIG. 1A, where the header 102 is shown mounted in bulkhead 112 or a wall of the enclosure containing the two printed circuit boards 106 and 108.

The section view of FIG. 1A shows each of the principal components of the first embodiment of the header 102 and the mating electrical connector receptacle 104. The header 102 has a one-piece molded insulative housing 120. This housing is molded from any of a number of engineering plastics. Header 120 has a rear, or outward, face 122 and an oppositely facing mating face or mating interface 124. The rear face 122 and the mating face 124 comprise the opposite faces of a common housing wall 126. The common housing wall 126 forms the internal wall defining the mating face 124 or the mating interface, and can therefore be referred to as a common internal wall. Sidewalls 128 extend from the common housing wall 126 to form the mating face configuration. Sidewalls 128 form a shroud with the mating face 124 comprising the internal face between sidewalls or within the shroud. A plurality of openings 130 extend through the common housing wall 126 between the rear face 122 and the mating face 124. The perspective view of FIG. 1C shows that these openings 130, and the terminal pins 140 extending through openings 130, are arranged in multiple rows. The housing 120 also includes a connector latch 134, which comprises means for mechanically securing the mating connector receptacle 104 to the header 102. Printed circuit board mounting supports 132 extend outward from the rear face 122 to secure the header 102 to the first printed circuit board 106 in a conventional manner. A peripheral flange 136 on the header 102 engages the bulkhead 112 or wall and a peripheral seal 138 establishes sealing integrity along this interface. The geometry of the flange 136 and seal 138 is intended to be representative only and any number of conventional sealing geometries can be substituted for this configuration.

As previously discussed the terminal pins 140 are separated into two groups. Group I includes those terminal pins 140 used to connect the header 102 to the first printed circuit board 106. In this embodiment, group I includes all of the terminal pins 140 in the lower three rows. The pins 140 in group II are used to connect the header 102 to the second printed circuit board 108 through the multiposition connector 114. The pins 140 used in this embodiment comprise conventional right angle printed circuit terminal pins. Each pin 140 in group I has a solder tail portion 142 that is configured for insertion in plated through holes in the first printed circuit board 106 where a soldered interconnection is formed. A pin mating section 144 is located on the other end of each terminal pin 140 in groups I and II. When the terminal pins are inserted through the openings 130 in the common housing wall 126, the pin mating section 144 of each pin will be at the mating interface of the header 102 for establishing an electrical connection with receptacle terminals 162 in mating connector receptacle 104. A right angle bend 146 is located between the pin mating section 144 and the solder tail sections 142 of the pins in group I. A right angle bend 146 is also formed between the pin mating section 144 and the rear pin section 148 of the pins 140 in group II. The pins in group I are bent downward and the pins in group II are bent upward in this embodiment so that the solder tails 142 extend in one direction for connection to the first printed circuit board 106 and the rear pins sections 148 extend in the opposite direction for mating with the electrical connector 114 and the second printed circuit board 108.

The mating receptacle connector 104, shown in FIG. 1A, is of conventional construction, and a connector of substantially the same configuration will mate with any of the headers of the other embodiments. For example, an equivalent receptacle having a different contact spacing would mate with the header 1202 in the embodiment of FIG. 12A. Since the mating receptacle connector can be considered substantially the same for the purposes of this invention, only the receptacle connector 104 will be described. The receptacle connector 104 has a molded housing 160 of substantially conventional construction which contains a plurality of cavities in which receptacle terminals 162 are positioned. Terminals 162 are conventional terminals that can be crimped to discrete wires (not shown). These terminals have a resilient contact section for maintaining contact with the header pin mating sections 144. The receptacle terminals are held in the housing by conventional flexible cantilever beam housing lances 168 in each cavity. These housing lances 168 are located on a rear section 166 of the two-piece receptacle housing, which telescopes to lock the lances 168 in place. Exterior latching arms 164 engage header latches 134 to mechanically secure the receptacle connector 104 to the header 102.

Figure 2A:
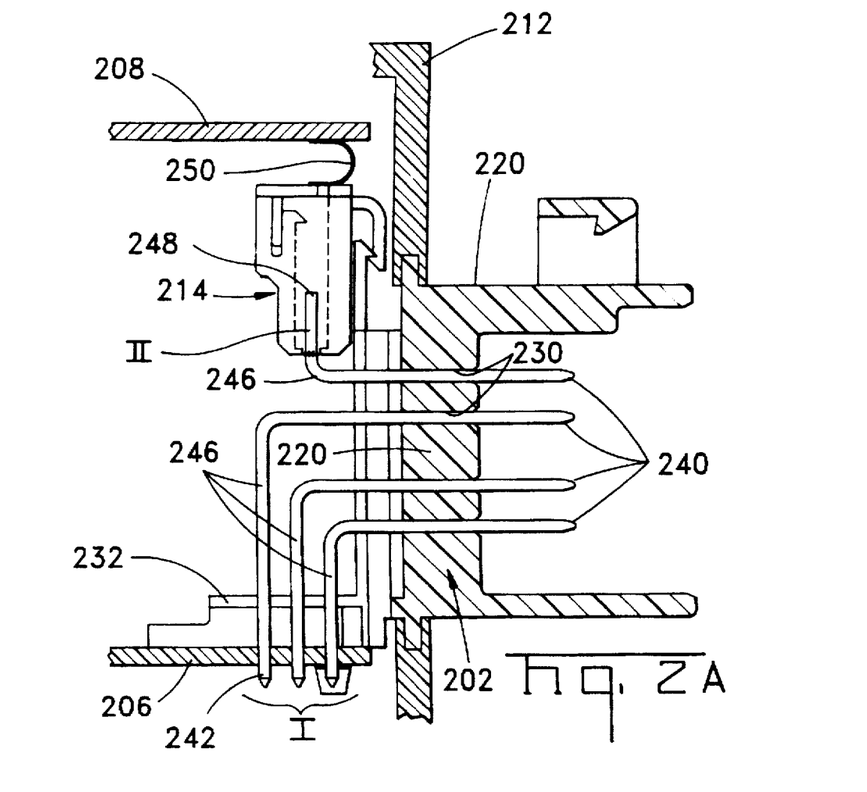
FIG. 2A is a sectional view of the electrical connector header.
Figure 2B:
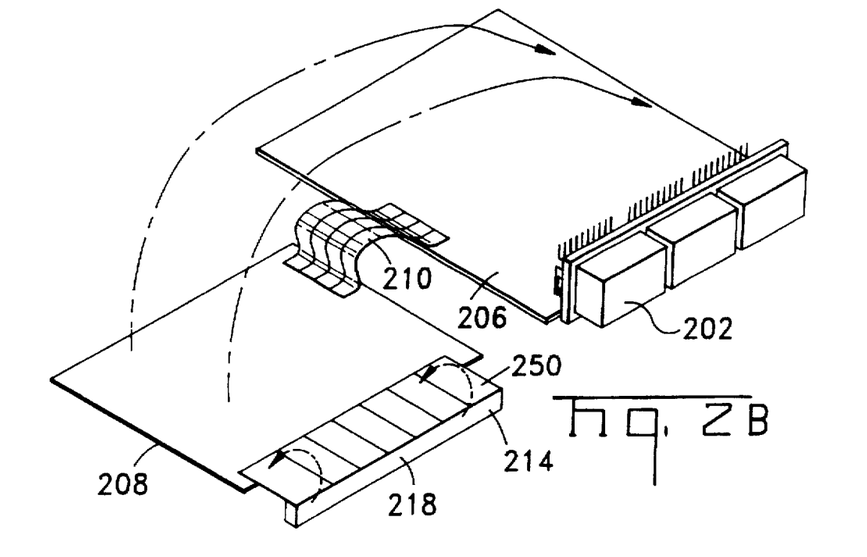
FIG. 2B is a schematic showing the manner in which the two printed circuit boards are attached to the electrical connectors.

The second embodiment of this invention shown in FIGS. 2A and 2B is substantially similar to the first embodiment. Only the different elements will be discussed. The multiposition electrical connector 214 is not rigidly attached to the second printed circuit board 208. Instead of surface mount terminals soldered directly to the second printed circuit board as in the first embodiment, this connector 214 uses terminals connected to conductors in a flexible jumper 250 extending between the connector 214 and the second printed circuit board 208. This flexible jumper 250 can use conventional crimped terminals with solder tails for attachment to the printed circuit board 208 and to terminals in the second connector 214. Alternatively, surface mount solder interconnections can be used. This connection to the printed circuit board could also be made using conventional hot bar soldering methods. Other conventional flexible flat cable and flexible etched circuit contacts can also be used to connect the flexible jumper. The use of the flexible jumper 250 allows the second printed circuit board to be mounted independently on the header 202. For example, the same multicomponent configuration could be used in different enclosures where the second printed circuit board 208 would be mounted in a different position in each application.

Figure 3A:
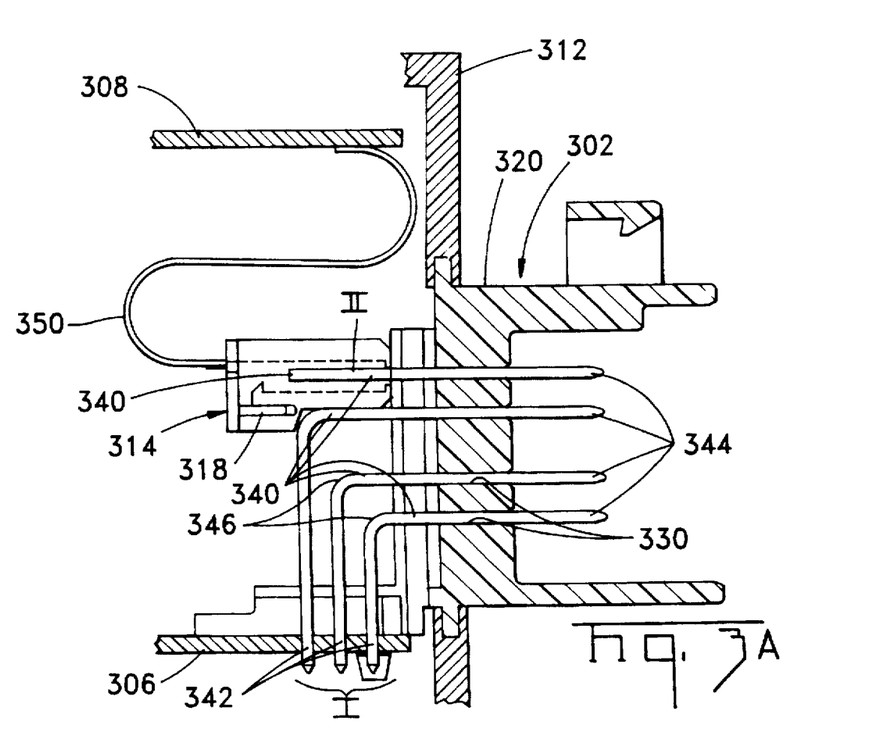
FIG. 3A is a sectional view of the electrical connector header.
Figure 3B:
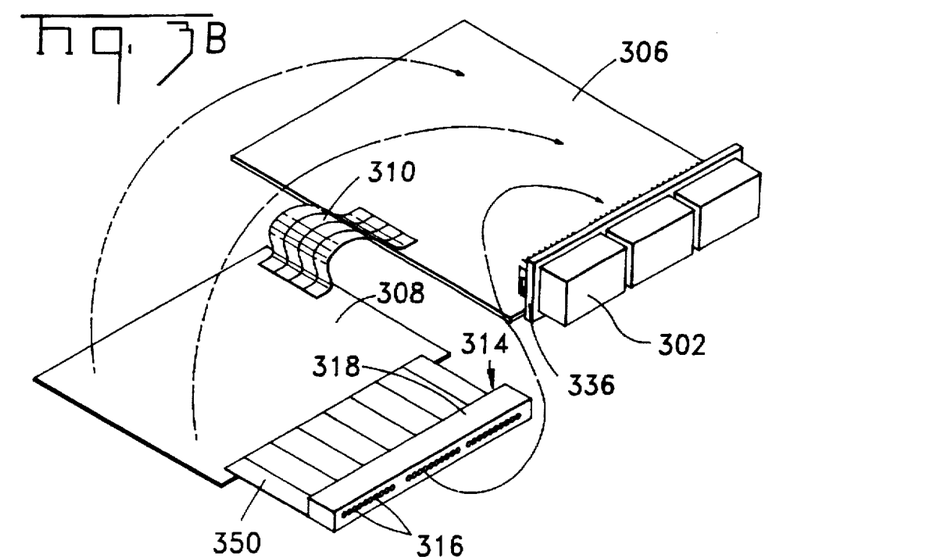
FIG. 3B is a schematic showing the manner in which the two printed circuit boards are attached to the electrical connectors.

The third embodiment of FIGS. 3A and 3B is similar to the second embodiment. This third embodiment also uses a flexible jumper 350 of the same general type as the flexible jumper 250 of the second embodiment. In the third embodiment, the terminal pins 340 of group II are straight pins instead of the right angle pins of the first and second embodiment.

Figure 4A:
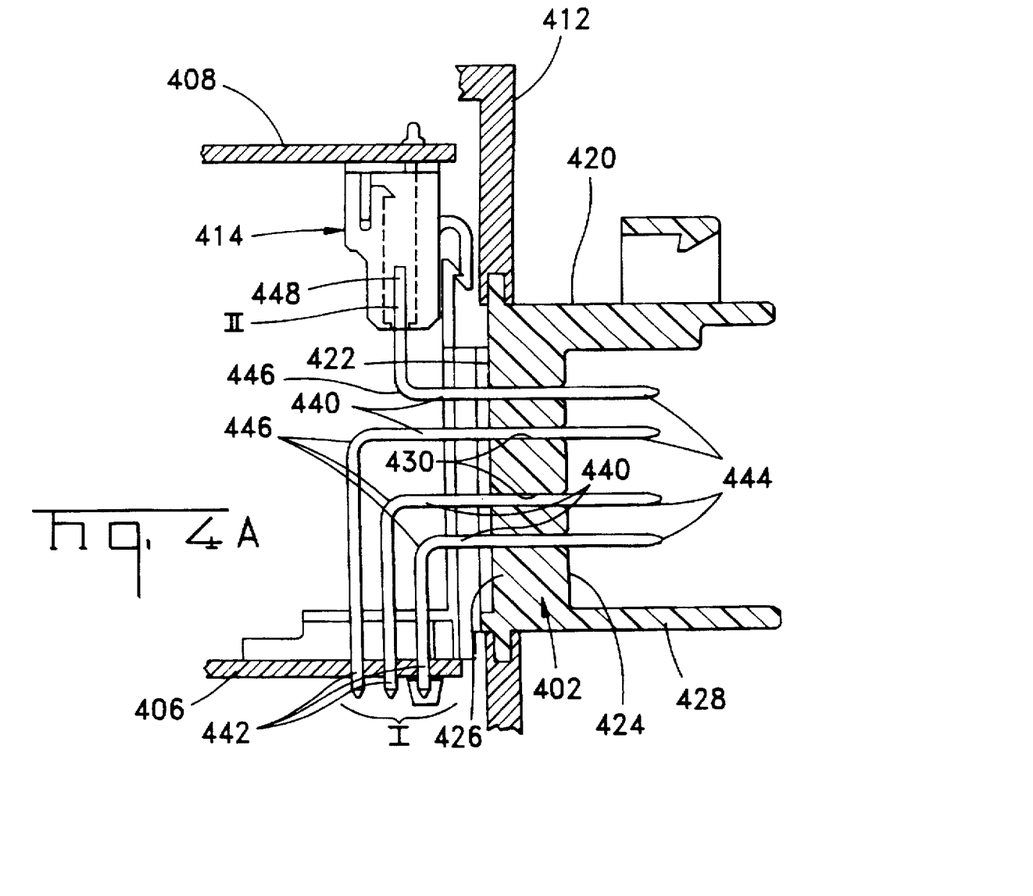
FIG. 4A is a sectional view of the electrical connector header.
Figure 4B:
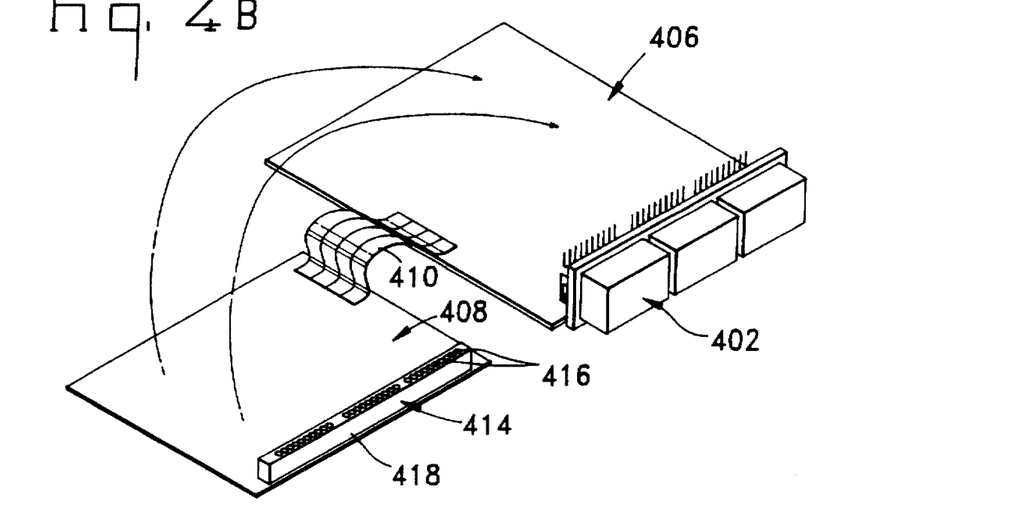
FIG. 4B is a schematic showing the manner in which the two printed circuit boards are attached to the electrical connectors.

The fourth embodiment of FIGS. 4A and 4B is substantially the same as the first embodiment of this invention. This fourth embodiment uses through hole terminals in the second multiposition connector 414. Otherwise the fourth embodiment is identical to the first embodiment.

Figure 5A:
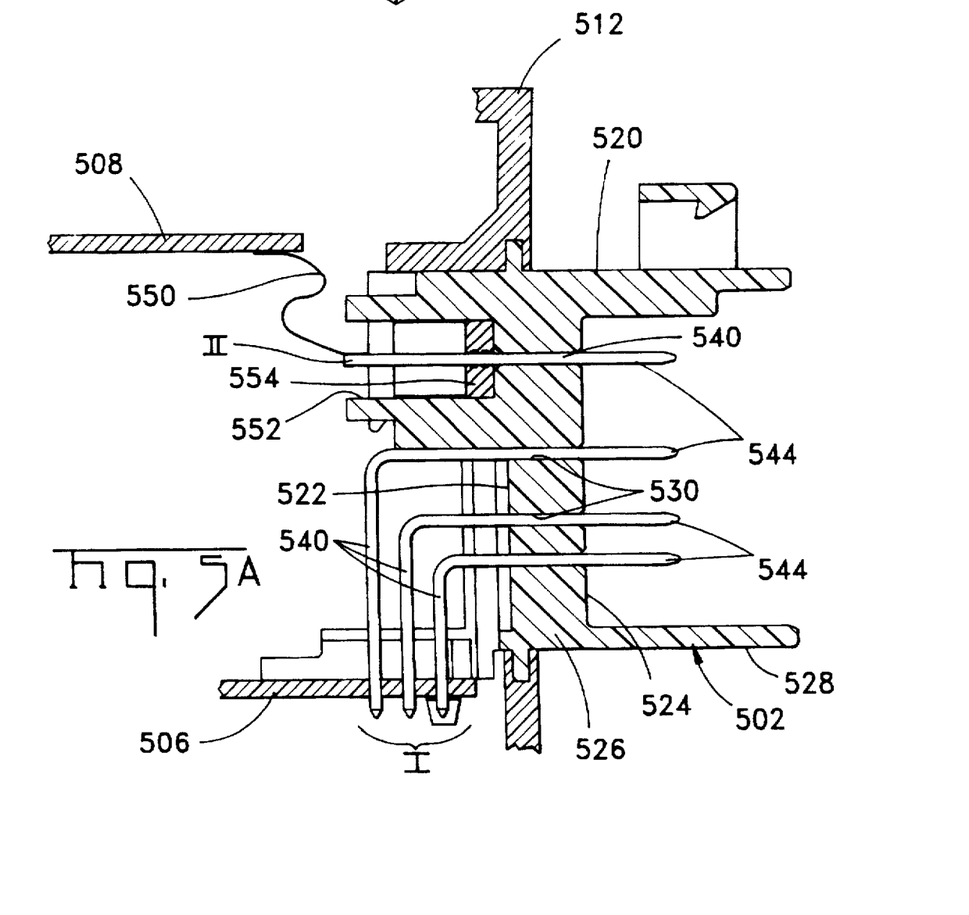
FIG. 5A is a sectional view of the electrical connector header.
Figure 5B:
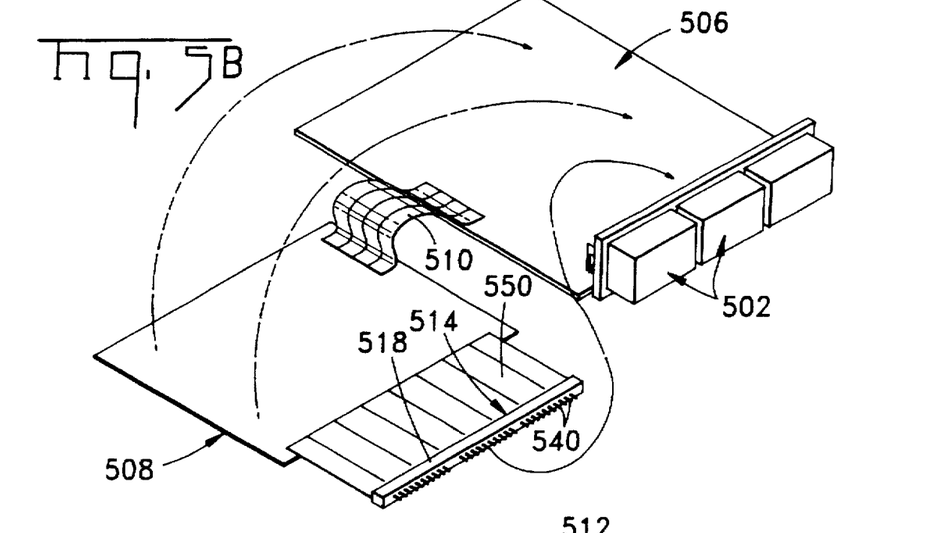
FIG. 5B is a schematic showing the manner in which the two printed circuit boards are attached to the electrical connectors.

The fifth embodiment of FIGS. 5A and 5B is the first of a series of embodiments in which the header housing 520 includes a rearwardly facing connector cavity 552. In this fifth embodiment the terminal pins 540 of group II are mounted in the second multiposition connector 514. This multiposition connector 514 can be inserted into the cavity 552, which communicates with the openings 530 in which the terminal pins 540 of group II are inserted. A seal 554 is positioned between the multiposition connector 514 and the housing 520 in the cavity 552. This seal 554 does constitute an additional sealing member, but is a preferable alternative to the seals that would be necessary in a split header. Here the seal 554 seals the openings 530 through which pins 540 of group II extend. The position and size of these openings 530 is defined and the tolerances associated with these passages are known and can be more easily controlled. Tolerances between abutting split header subassemblies are much more difficult to control and that interface would therefore be more difficult to seal. Each of the pins 540 is connected to the second printed circuit board 508 by a flexible cable 550. Conventional crimped terminals, or other conventional terminals and methods, can be used to connect the flexible cable 550 to both the pins 540 and to the printed circuit board 508.

Figure 6A:
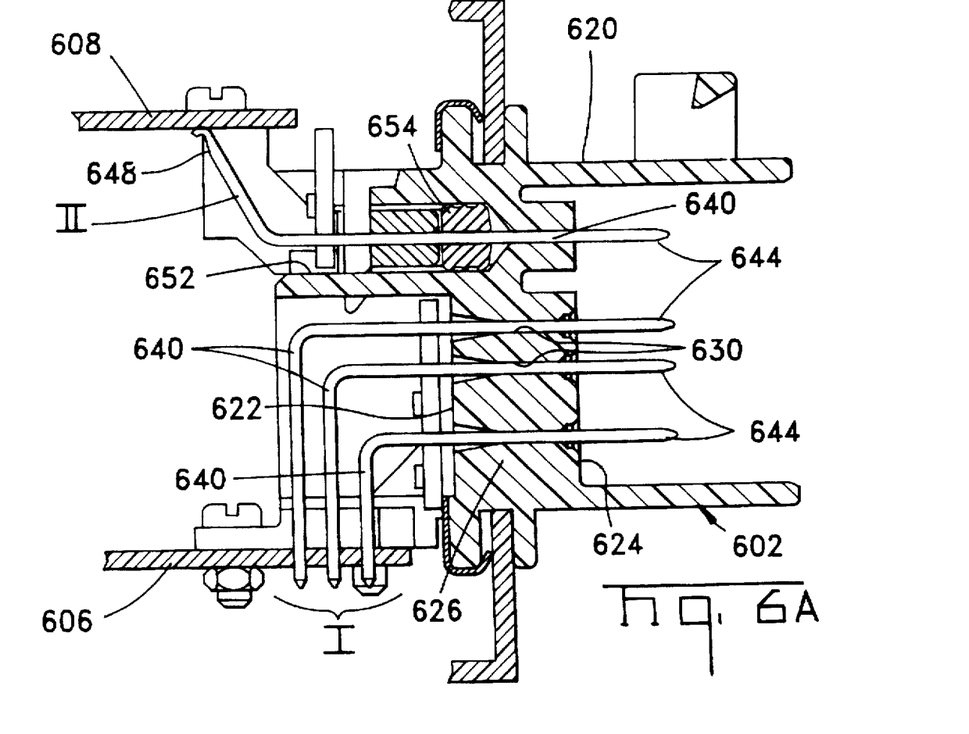
FIG. 6A is a sectional view of the electrical connector header.
Figure 6B:
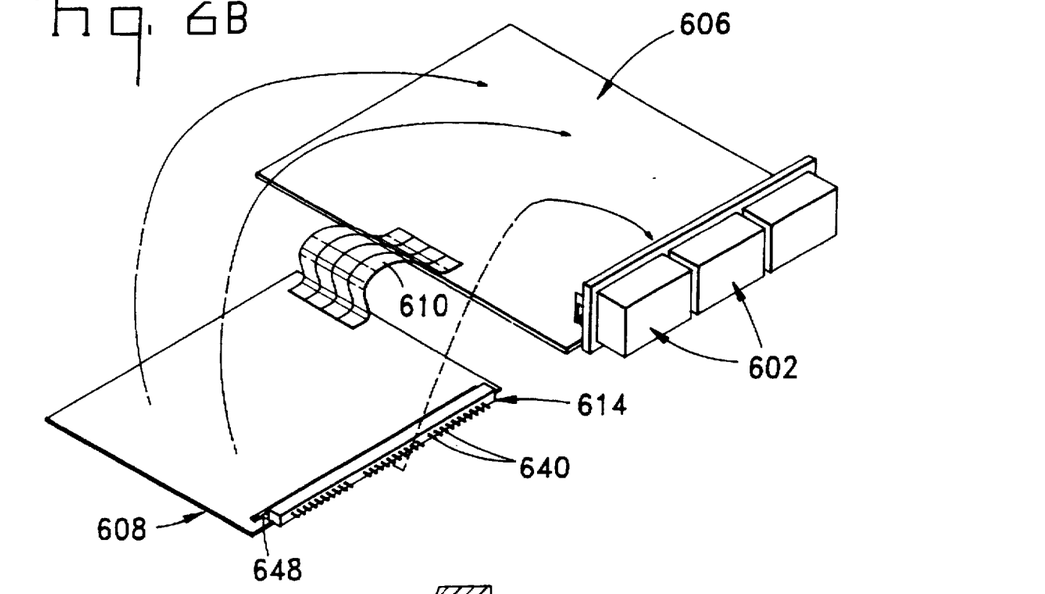
FIG. 6B is a schematic showing the manner in which the two printed circuit boards are attached to the electrical connectors.

The sixth embodiment of FIGS. 6A and 6B is similar to the fifth embodiment. In this embodiment the terminal pins 640 are also mounted in a second multiposition connector 614 which is similar to the connector 514 of the fifth embodiment. The rearwardly facing cavity 652 and the header housing 620 are substantially the same as the corresponding components in the fifth embodiment. The sixth embodiment does not employ a flexible cable. Instead the terminal pins 640 of group II include surface mount contacts on the rear terminal section 648. The pins of group II are therefore soldered directly to the second printed circuit board 608 prior to mounting the assembly in its enclosure and prior to insertion of connector 614 into the cavity 652.

Figure 7:
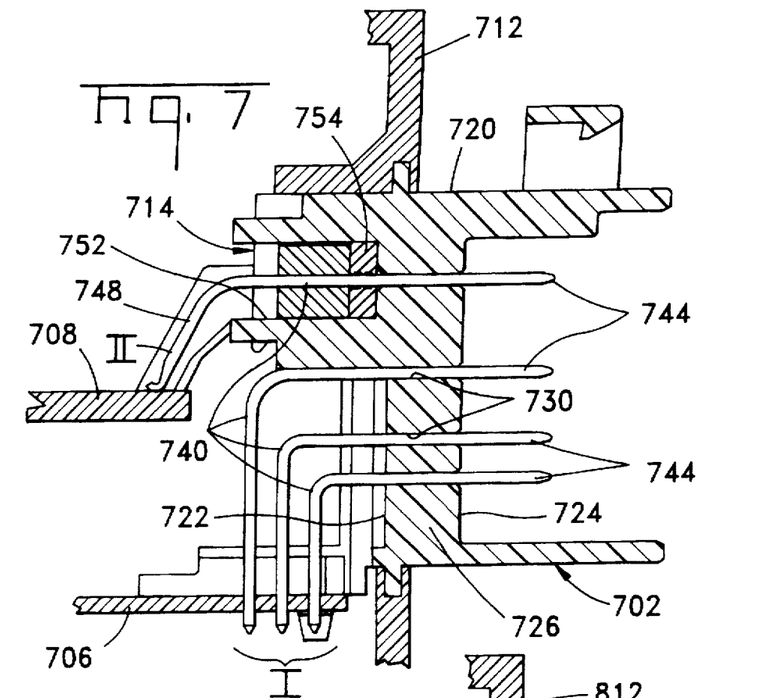
FIG. 7 is a sectional view of a seventh embodiment of this invention. This seventy embodiment is similar to the sixth embodiment, but the orientation of the surface mount solder tails on the individual pins is reversed.

The seventh embodiment of FIG. 7 is similar to the sixth embodiment. The only significant difference is that the terminal pins of group II are bent downward for connection to a second printed circuit board 708 which is mounted midway between the top and bottom of the header 702. Although the sixth and seventh embodiments each use a surface mount solder contact, a through hole connection could also be employed.

Figure 8:
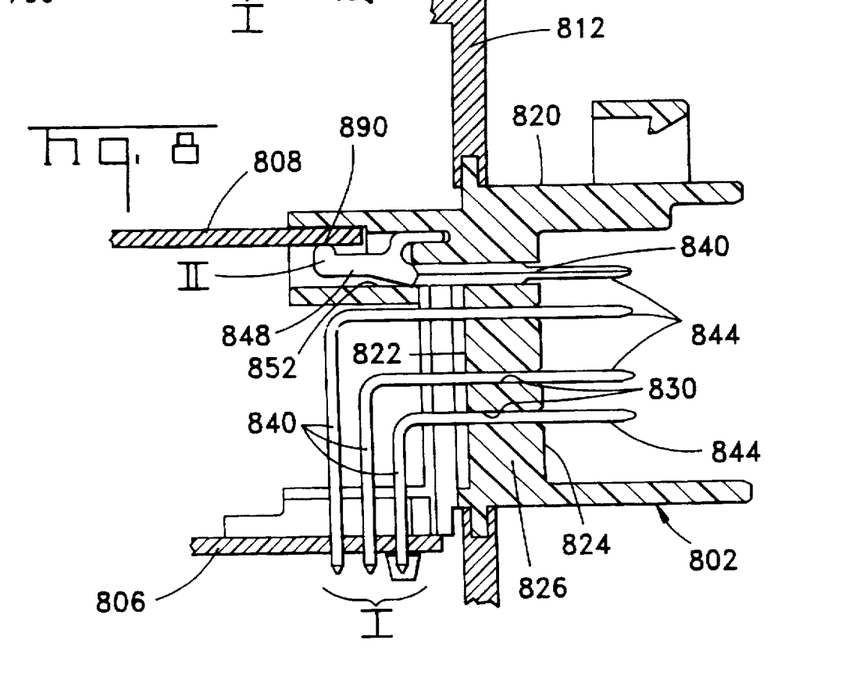
FIG. 8 is a sectional view of an eighth embodiment of this invention in which the pins to be connected to the second printed circuit board include contacts for engaging pads on one surface of a printed circuit board and the rear of the connector header includes a cavity in which the printed circuit board can be inserted.

The eighth embodiment of this invention shown in FIG. 8 is the first of a series of embodiments in which each of the terminals 840 of group II have a contact interface at its rear end for establishing contact directly with a pad on the surface of the second printed circuit board 808. The terminals 840 of group II are stamped and formed terminal initially formed from a flat blank. By using a stamped and formed terminal, a board contact section 890 can be formed at the end of the rear terminal sections 848. This rear terminal section 890 is of the type used conventionally on printed circuit board edge connectors. To establish this connection, a second printed circuit board 808 with contact pads located on its lower surface is inserted into the cavity 852 on the rear of the header housing 820. The printed circuit board is inserted between the top wall of cavity 852 and the contact section 890. In each of these stamped and formed embodiments, a conventional sealing gel can be inserted to seal the interior of the stamped and formed pins.

Figure 9:
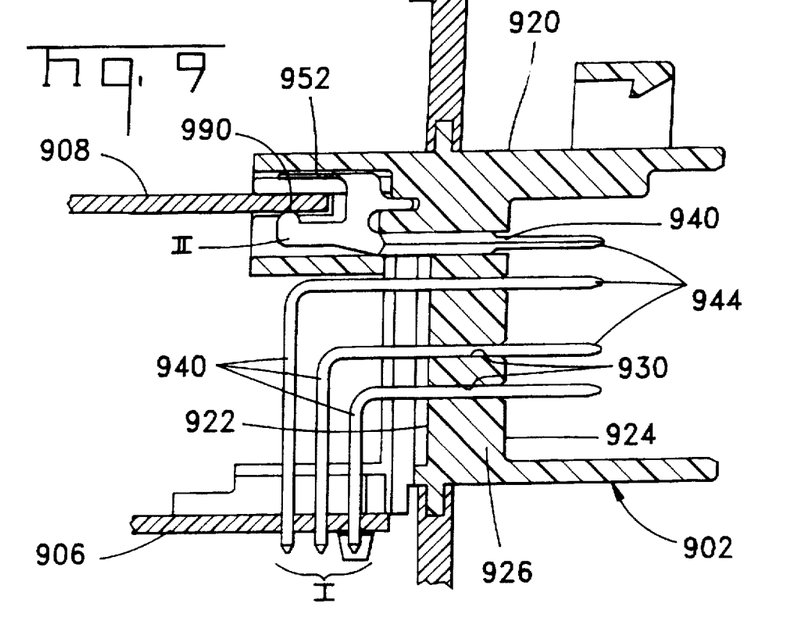
FIG. 9 is a sectional view of a ninth embodiment of this invention which is similar to the embodiment of FIG. 8. This embodiment uses a special contact which engages one side of the printed circuit board and mechanically supports the opposite side of the printed circuit board without directly contacting it.

The ninth embodiment of FIG. 9 also uses a stamped and formed edge card pin section on the terminal pins 940 of group II. This contact section also includes a section which supports the top of the printed circuit board 908 inserted into the cavity 952. In this configuration the contact supports the plastic cavity wall, which in turn engages the top of the printed circuit board to support the opposite side of the printed circuit board.

Figure 10A:
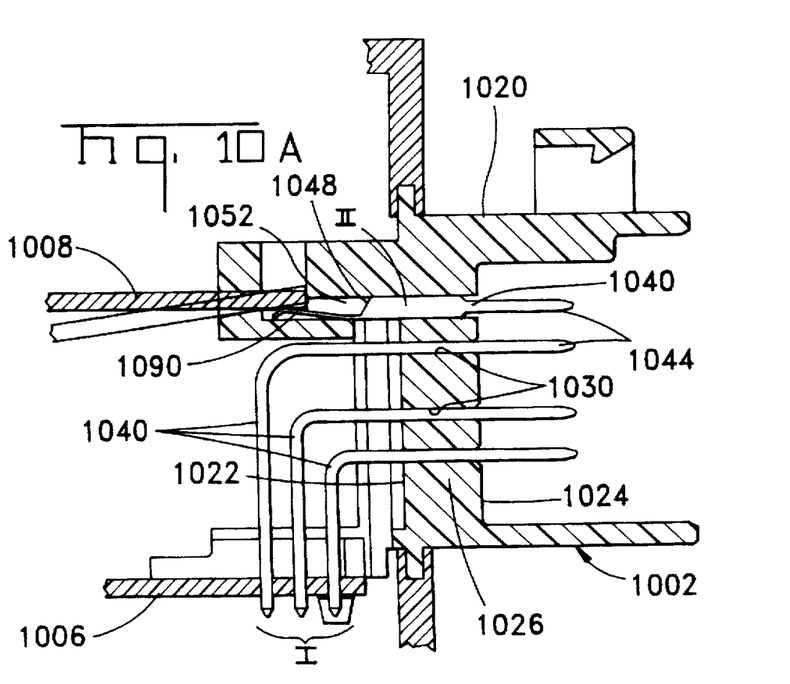
FIG. 10A is a sectional view of a tenth embodiment of this invention in which the terminal pins for establishing engagement with the second printed circuit board are stamped and formed and in which a spring on each stamped and formed pin engages a pad on the surface of the second printed circuit board.
Figure 10B:
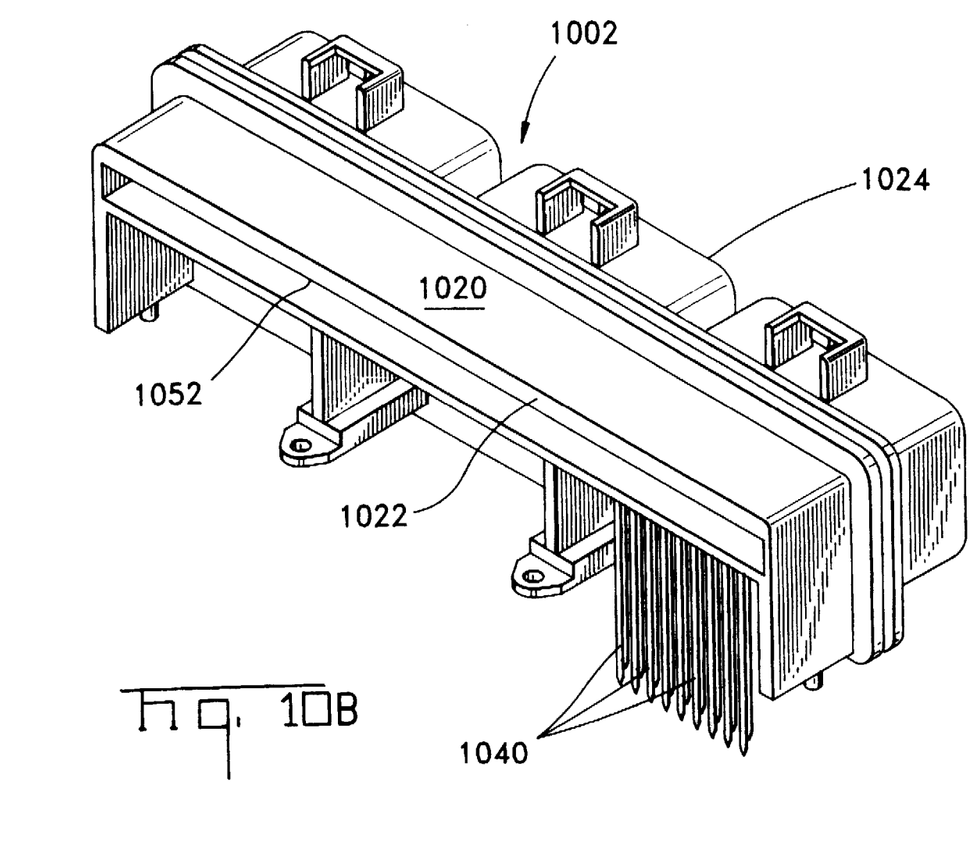
FIG. 10B is a perspective view of the header housing of the tenth embodiment.

The tenth embodiment of FIGS. 10A and 10B also uses a stamped and formed pin 1040 for the pins of group II. The rear section 1048 of this stamped and formed pin includes a resilient spring contact 1090 of substantially conventional construction. It engages the contact pads on the lower surface of the printed circuit board 1080 when the board is inserted into the cavity 1052, which here is in the form of a slot for receiving the printed circuit board. FIG. 10B is a rear perspective view of this housing showing the cavity slot 1052 positioned above the right angle terminal pins 1040 of group I.

Figure 11:
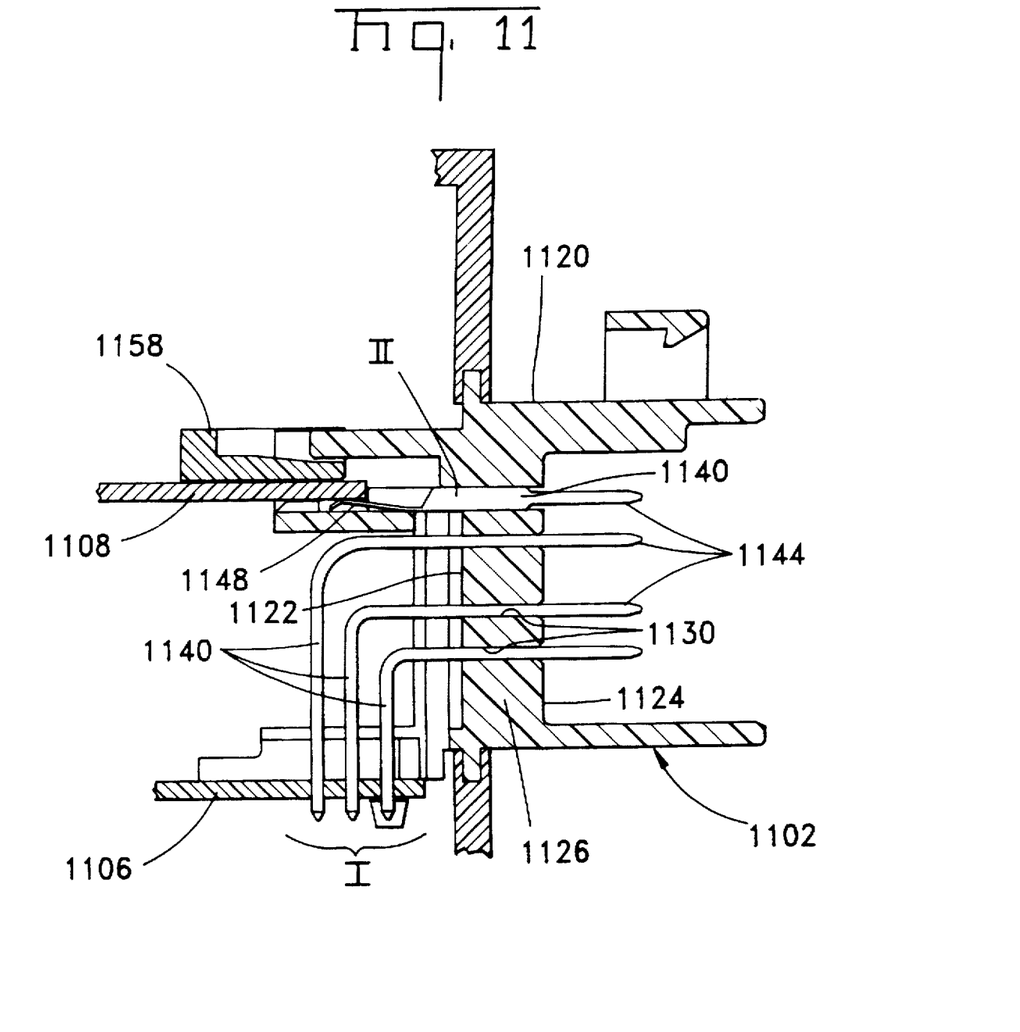
FIG. 11 is a sectional view of an eleventh embodiment of this invention in which a separate wedge is inserted between the second printed circuit board and the header housing to establish engagement between pads on a printed circuit board and a spring on a stamped and formed pin.

The eleventh embodiment of FIG. 11 is similar to the tenth embodiment. This embodiment also uses a stamped and formed terminal pin 1140 of the same type as stamped and formed pins 1040. In the eleventh embodiment a wedge 1158 is inserted into the cavity 1152 after the printed circuit board 1108 has been fully inserted. The wedge 1158 pushes the printed circuit board 1108 into engagement with the spring 1190 on the rear pin section 1148.

Figure 12A:
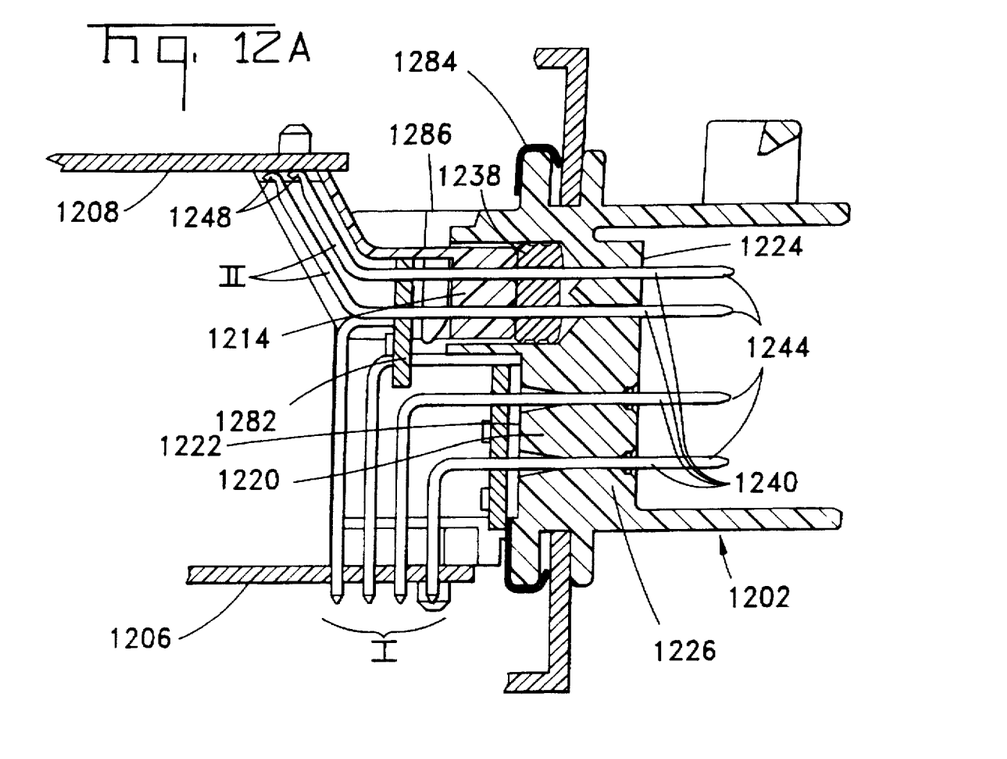
FIG. 12A is a sectional view showing a filter printed circuit board and a shield.
Figure 12B:
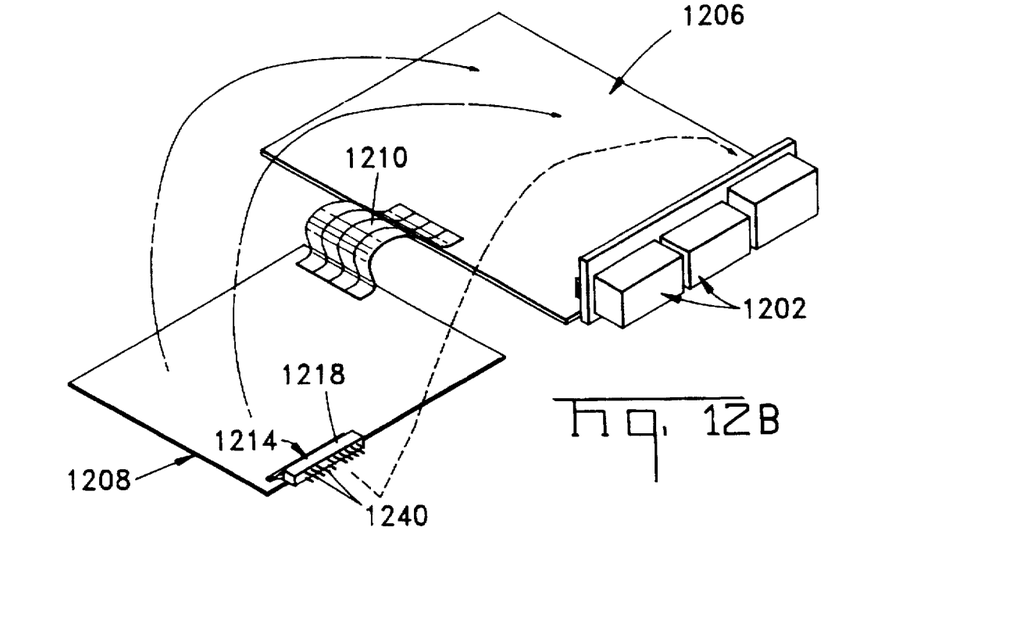
FIG. 12B is a schematic showing the manner in which the two printed circuit boards are attached to the input/output header.

The twelfth embodiment of FIGS. 12A and 12B is similar to the sixth and seventh embodiments. This embodiment shows that two rows of terminal pins 1240 can be included in group II for connection to the second printed circuit board 1208. This embodiment also shows the addition of filtering and shielding to a connector of this type. Filtering is added by attaching a filter printed circuit board 1282, containing filter components such as surface mount capacitors, onto the pin terminals 1240 of both groups I and II. A shield or ground plane 1284 is mounted on the exterior of the header housing 1220 where it engages the metal bulkhead 1212. The shield 1284 also engages the filter printed circuit board 1282. Similar shields and filter subassemblies are also depicted in FIG. 6A. In addition to the filtering and shielding, the twelfth embodiment also shows that a connector position assurance member 1286 can be used to insure that the multiposition connector 1214 is fully inserted into the cavity 1252 at the rear end of the housing 1220 so that the pins 1240 of the second group II are fully inserted.

The numerous representative embodiments depicted herein show that this invention can be adapted to a number of different embodiments. Therefore the invention as claimed is not limited only to one embodiment, nor is it limited only to the twelve embodiments included to represent the embodiment.

We claim:

1. An input/output electrical connector header for use with multiple printed circuit boards, comprising:

a plurality of terminal pins in multiple rows;

an insulative housing having a common housing wall comprising a common internal wall forming at least a portion of a mating interface for engaging a mating electrical connector receptacle, the common internal wall comprising an integrally molded portion of the insulative housing with openings extending through the common internal wall, terminal pins in all of the multiple rows extending through the openings in the common internal wall;

board contact tails, for connection to a first printed circuit board, on the terminal pins in a first row, the pins in the first row extending in a first direction on the rear of the insulative housing for connection to the first printed circuit board; and a second printed circuit board connection at the rear of the terminal pins in a second terminal row, terminal pins in the second row extending in a second direction, on the rear of the insulative housing, different from the first direction for connection to a second printed circuit board, the second printed circuit board connection being separable from the insulative housing and including a separable electrical connector disengagable from the terminal pins in the second row.

2. The header of claim 1 wherein the terminal pins are received in the openings in the common internal wall so as to be impervious to the passage of fluids.

3. The header of claim 1 wherein the second printed circuit board connection at the rear of the terminal pins comprises a permanent connection to the terminal pins in the second row, the terminals pins in the second row being insertable and removable from the openings in the common internal wall.

4. The header of claim 1 wherein the second printed circuit board connection at the rear of the terminal pins in the second row comprises a portion of each terminal pin in the second row.

5. The header of claim 1 wherein the second printed circuit board connection comprises a connection separable from the second printed circuit board.

6. The header of claim 1 wherein the second printed circuit board connection comprises a connection permanently attachable to the second printed circuit board.

7. The header of claim 1 wherein the second printed circuit board connection comprises a flexible connection between each terminal pin in the second row and the second printed circuit board.

8. The header of claim 1 wherein each terminal pin in the second terminal row comprises a stamped and formed terminal pin including a printed circuit board contact section on the rear end thereof.

9. The header of claim 1 wherein each terminal pin comprises a solid pin.

10. The header of claim 1 wherein each terminal pin in the second terminal row includes a surface mount solder contact section on the rear thereof.

11. An input/output electrical connector header assembly for use with multiple printed circuit boards, comprising:

a plurality of terminal pins in multiple rows;

an insulative housing having openings extending between a mating face and a rear face of the housing, terminal pins in all of the multiple rows extending through the openings in the housing;

board contact tails, for connection to a first printed circuit board, on the terminal pins in a first row, the pins in the first row extending in a first direction on the rear of the insulative housing for connection to the first printed circuit board; and a multiposition electrical connector attachable to and detachable from rear ends of the terminal pins in a second terminal row for connecting the terminal pins in the second row to a second printed circuit board, terminal pins in the second row extending in a second direction, on the rear of the insulative housing, different from the first direction for connection to the second printed circuit board.

12. An input/output assembly comprising:

a first printed circuit board;

a second printed circuit board positioned parallel to the first printed circuit board;

an electrical connector assembly having multiple rows of terminal pins, terminal pins in at least a first row being electrically connected to the first printed circuit board and terminal pins in at least a second row being electrically connected to the second printed circuit board, the electrical connector assembly including an insulative housing having openings extending between a mating face and a rear face of the housing, terminal pins in all of the multiple rows extending through the openings in the housing;

board contact tails, for connection to a first printed circuit board, on the terminal pins in a first row, the pins in the first row extending in a first direction on the rear of the insulative housing for connection to the first printed circuit board; and a second printed circuit board connection at the rear of the terminal pins in a second terminal row, terminal pins in the second row extending in a second direction, on the rear of the insulative housing, different from the first direction for connection to a second printed circuit board, the second printed circuit board connection being separable from the insulative housing and including a separable electrical connector disengagable from the terminal pins in the second row.

* * * * *